United States Patent [19]

Burch et al.

[11] 4,350,756
[45] Sep. 21, 1982

[54] PROCESSING OF RADIATION SENSITIVE PLATES

[75] Inventors: Jeremy R. Burch, Wilberfoss; David E. Murray, Leeds, both of England

[73] Assignee: Vickers Limited, London, England

[21] Appl. No.: 231,416

[22] Filed: Feb. 4, 1981

[30] Foreign Application Priority Data

Jan. 29, 1980 [GB] United Kingdom ............... 8002934

[51] Int. Cl.³ .................. G03F 7/02; G11D 17/00
[52] U.S. Cl. ............... 430/331; 252/174.21; 252/174.22
[58] Field of Search ............ 430/331; 252/174.21, 252/174.22, 108, 321

[56] References Cited

U.S. PATENT DOCUMENTS

| 3,208,949 | 9/1965 | Rosnati | 252/174.21 |
| 3,547,632 | 12/1970 | Nadeau | 430/331 |
| 3,629,122 | 12/1971 | Jakobi | 252/321 |
| 3,707,373 | 12/1972 | Martinson et al. | 430/331 |
| 3,745,028 | 7/1973 | Rauner | 430/331 |
| 3,791,828 | 2/1974 | Moore | 430/331 |
| 4,055,515 | 10/1977 | Kirch | 430/331 |
| 4,147,545 | 4/1979 | Rowe et al. | 430/331 |
| 4,268,613 | 5/1981 | Okishi | 430/331 |
| 4,287,082 | 9/1981 | Tolfo et al. | 252/174.21 |

FOREIGN PATENT DOCUMENTS 2032849  5/1980  United Kingdom ............... 430/331

Primary Examiner—Mary F. Downey
Attorney, Agent, or Firm—Poms, Smith, Lande & Rose

[57] ABSTRACT

A developer for processing image-wise exposed negative-working radiation sensitive plates based on organic solvent soluble diazo resins or certain photocrosslinkable resins or photopolymerizable olefinically unsaturated compounds includes a surfactant and a salt of an aliphatic carboxylic acid containing up to nine carbon atoms. The developer is substantially aqueous and has a reduced tendency to foam formation. It is useful in the photomechanical production of lithographic printing plates.

12 Claims, No Drawings

PROCESSING OF RADIATION SENSITIVE PLATES

This invention relates to the processing of radiation sensitive plates in, for example, the production of lithographic printing plates.

Lithographic printing plates comprise ink receptive water repellant printing areas and water receptive ink repellant non-printing areas. The printing and non-printing areas are essentially coplanar. During printing, an aqueous medium is applied to the plate. This wets the non-printing areas but is repelled by the printing areas. An oleophilic printing ink is applied and this is accepted by the printing areas but repelled by the wet non-printing areas. Ink is then transferred from the printing areas to the member being printed.

Such printing plates are conventionally produced photomechanically. In this technique, a suitable substrate is coated with a radiation sensitive material and the resultant radiation sensitive plate is imagewise exposed to radiation. This is effected using a transparent film having opaque areas. A negative transparency of the image desired to be reproduced is used for exposing a so-called negative-working radiation sensitive plate and a positive transparency is used for exposing a so-called positive-working radiation sensitive plate. Thus, for example, in the case of negative-working plates, the clear areas of the negative transparency correspond to the image and radiation passing through these clear areas causes a reaction in the radiation sensitive coating that insolubilises the coating in the image area. Radiation does not pass through the opaque areas of the transparency, however, so that the radiation sensitive coating underlying such areas remains unaffected. The exposed plate is then processed by selectively removing the non-radiation struck areas of the coating using a suitable developer so as to reveal the underlying surface of the substrate. If the revealed surface is not hydrophilic, it is then made so and serves as the non-printing areas of the plate. The insolubilised coating remaining on the substrate after development then constitutes the printing areas of the plate.

Typical of the radiation sensitive materials commonly used for negative working plates is a photocrosslinkable material containing groups of the structure —CH═CH—CO—, for example, polyvinyl cinnamate. Whilst printing plates formed from radiation sensitive plates based on these materials are satisfactory from the aspect of printing life, i.e. the number of satisfactory copies produced and the radiation sensitive plates have a satisfactory storage life, i.e. they may be stored for a considerable period prior to being exposed and developed, these materials have the disadvantage that they are not developable in aqueous media. Thus developers essentially based on strong organic solvent liquids have to be used for the developing step. Many of these solvent liquids are toxic, unpleasant to use, or produce problems with regard to their disposal. Examples of such solvent liquids are cyclohexanone, methoxybutyl acetate, 2-methoxyethyl acetate and dimethyl formamide.

In view of the increasing concern over health and pollution, the printing plate manufacturing industry sought to provide a negative-working presensitised plate that did not require the use of these solvent liquids but which would still be satisfactory in terms of printing and storage life. The problem was partially solved by using, as the radiation sensitive material, a water soluble diazo resin for example the condensation product of 4-diazodiphenylamine phosphate and formaldehyde. Whilst such materials were satisfactory in that water could be used as the developer, printing plates formed from them did not have a good enough printing life unless given suitable treatment with, for example, a reinforcing lacquer and radiation sensitive plates formed from them did not have a good enough storage life. These problems were overcome by the use of organic solvent soluble diazo resins such as those described in British Patent Specifications No. 944,276 (Example 2), No. 1,010,203 (Example III), No. 1,041,463 (Examples 2 and 3), No. 1,055,079, and No. 1,388,038 and in Japanese Patent Application 66/6813. Such organic solvent soluble diazo resins do not suffer from the above disadvantage yet can still be processed with developers consisting substantially of water, for example an aqueous solution containing propanol, a sulphonic acid and a non-ionic surfactant. In some cases, however, the amount of n-propanol or sulphonic acid required to remove the non-radiation struck areas is such that the radiation struck areas are also attacked causing over development of the plate. In addition, whilst n-propanol is better in the above respects compared to the organic solvents conventionally used for the photopolymerisable materials, it is highly flammable, evaporates rapidly and has an unpleasant smell. It has the advantage, however, of suppresing the foaming capability of the surfactant and its absence can lead to the developer producing excessive foam when used in an automatic processing machine.

Surprisingly, it has now been found that the inclusion, in substantially aqueous developers, of salts of certain aliphatic carboxylic acids has a marked defoaming effect. Accordingly, the present invention provides in a substantially aqueous developer of the type which contains a non-ionic surfactant and is suitable for processing image-wise exposed negative working radiation sensitive plates, the improvement which comprises the inclusion of a salt of an aliphatic carboxylic acid containing up to nine carbon atoms.

The acid, may be saturated or unsaturated and the salt may be, for example, a sodium, potassium or other alkali metal salt, an ammonium salt, or a triethanolamine salt.

Salts of acids containing ten or more carbon atoms do not have a defoaming effect. On the contrary, they tend to increase and stabilise the foam. Preferably, the acid contains 7 or 8 carbon atoms as the salts of these acids increase the action of the developer as well as acting as foam suppressants. Examples of suitable acids are propanoic, valeric, octanoic, 2-ethyl hexanoic, nonanoic, heptanoic and sorbic acids. Mixtures of aliphatic acid salts may be used.

The amount of aliphatic acid salt present in the developer should be at least the amount necessary to have a significant defoaming affect. Thus, for example, the developer should contain at least about 20 grams per liter of the aliphatic acid salt. In principle, the developer may contain as much aliphatic acid salt as is necessary to form a saturated solution. In practice, however, the developer should contain rather less aliphatic acid salt than that and a typical, maximum figure will be about 300 grams per liter.

The amount of surfactant present in the developer may vary considerably depending upon the nature of the radiation sensitive material. Typical amounts are from about 5 to about 30% v/v and examples of surfactants which may be used are the non-ionic surfactants such as, alkoxylates, alkylphenol ethoxylates, alcohol ethoxylates, amine ethoxylates, ester ethoxylates, alkylolamide ethoxylates, lanolin ethoxylates, propoxylates, block polymers, alkylolamides, and esters. Preferred surfactants are optionally modified alcohol alkoxylates or phenol alkoxylates. Mixtures of non-ionic surfactants may be used.

According to a preferred feature, the developer additionally contains a salt of an aromatic carboxylic acid. The salt may be for example a sodium, potassium, or other alkali metal salt, an ammonium salt or a triethanolamine salt. It has been found that the combination of the salts of aliphatic and aromatic acids has a synergistic effect in that the combination has a better developing action than a salt of either acid alone. Typically, the developer may contain from 20 to about 300 grams per liter of aromatic acid salt and mixtures of aromatic acid salts may be used. Examples of suitable aromatic carboxylic acids are benzoic and toluic acids.

Preferably the developer has a pH in the range of from about 6 to about 11.

The developers of the present invention may additionally include effective amounts of colourants and perfumes and also small amounts of water miscible organic solvents, anionic surfactants and dispersing agents.

The developer of the present invention is particularly suitable for use with radiation sensitive plates based on radiation sensitive materials which are conventionally developed in aqueous media such as the aforementioned organic solvent soluble diazo resins. Examples of such resins are 4-diazodiphenylamine bisulphate or phosphate/formaldehyde condensation products which have been modified by reaction with a salt, such as sodium tri-isopropyl naphthalene sulphonate, sodium dodecyl benzene sulphonate or sodium 4-nitrobenzene sulphonate, to make them less water soluble.

It has, however, also been found that the developers of the present invention can be used to develop radiation sensitive materials based on certain photocrosslinkable resins such as those disclosed in U.K. patent specification No. 1,377,747 and also to develop radiation sensitive materials based on certain photopolymerisable olefinically unsaturated compounds such as pentaerythritol triacrylate; a diacrylate of a liquid bisphenol A epoxy resin (e.g. Epocryl DRH-302 from Shell Chemicals); an acrylate urethane oligomer (E.g UCAR Actomer X-116 from Union Carbide); 2,2,5,5-tetraacryloxy methyl cyclophentanone; and diacrylate of bisphenol A diglycidyl ether.

The following Examples illustrate the invention.

EXAMPLE 1

An aluminium sheet was electrochemically grained, anodised, treated with polyvinyl phosphonic acid and then whirler coated with a light sensitive coating comprising the reaction product of 4-diazodiphenylamine bisulphate/formaldehyde condensate and sodium tri-isopropyl naphthalene sulphonate to form a negative working radiation sensitive plate. The coating weight was 0.7 g/m$^2$. After exposure to ultra violet light through a negative transparency, the plate was developed using a solution comprising 4% w/v of sodium propanoate, 10% w/v of sodium benzoate and 20% v/v of Ethylan HB4, the remainder of the solution being water. Ethylan HB4 is a phenol ethoxylate manufactured by Diamond Shamrock Ltd.

The developed plate was desensitised in the conventional manner and produced many satisfactory copies when on a press. No foaming problems were encountered when the developer was used in a Howson-Algraphy negative processing machine to develop a number of plates.

EXAMPLE 2

Example 1 was repeated except that the developer was a solution containing 5% w/v of sodium valerate, 10% w/v of sodium benzoate, 10% v/v of Ethylan HB4 and 10% v/v of Antarox LF 330, the remainder being water. Antarox LF330 is a modified alcohol ethoxylate manufactured by GAF Surfactants. Similar results were obtained.

EXAMPLE 3

Example 1 was repeated using as the developer an aqueous solution containing 15% w/v of sodium ocatanoate and 15% v/v of Antarox LF330, the remainder being water. Similar results were again obtained.

EXAMPLE 4

An aluminium sheet prepared in the same way as that of Example 1 was whirler coated with the reaction product of 4-diazodiphenylamine bisulphate/formaldehyde condensation product and the sodium salt of dodecyl benzene sulphonic acid at a coating weight of 0.8 g/m$^2$. The resultant radiation sensitive plate was then image-wise exposed and developed using an aqueous solution containing 9% w/v of sodium 2-ethyl hexanoate, 9% w/v of sodium toluate, and 15% v/v of Antarox LF330, the remainder being water. Results similar to those of Examples 1 to 3 were obtained.

EXAMPLE 5

Example 3 was repeated except that the sodium octanoate was replaced by a similar amount of sodium nonanoate. Similar results were obtained.

EXAMPLE 6

Example 1 was repeated except that (i) the sodium tri-isopropyl-naphthalene sulphonate was replaced by the sodium salt of 4-nitrobenzene sulphonic acid, (ii) the coating also contained 5 g. of Victoria Cyan (BASF) per 100 g of resin, and (iii) the developer was an aqueous solution containing 10% w/v of potassium benzoate, 10% w/v of potassium heptanoate and 15% v/v of Ethylan CPG945, the remainder being water. Ethylan CPG945 is a modified alcohol etoxylate manufactured by Diamond Shamrock Ltd. Similar results were again obtained.

EXAMPLE 7

Example 6 was repeated except that the developer was an aqueous solution containing 6% w/v of sodium sorbate, 10% w/v of sodium benzoate and 20% v/v of Ethylan HB4, the remainder being water. Similar results were again obtained.

EXAMPLE 8

The developer of Example 7 was used to develop an image wise exposed plate having a radiation sensitive coating comprising 4 parts by weight of the reaction product of 4-diazodiphenylamine bisulphate/formaldehyde condensate and sodium tri-isopropyl naphthalane sulphonate and 1 part by weight of a fully hydrolysed styrene/maleic anhydride copolymer. Similar results were obtained.

EXAMPLE 9

An aluminium sheet prepared according to Example 1 was whirler coated with a mixture of (a) the reaction product of 4-diazodiphenylamine phosphate/formaldehyde condensate and the sodium salt of dodecylbenzene sulphonic acid and (b) an equal weight of an acrylic resin (Macronal SN510 manufactured by Resinous Chemicals, a division of Hoechst AG). The resultant radiation sensitive plate was exposed to UV light through a negative transparency and then developed using an aqueous solution comprising 9% w/v of potassium octanoate, 9% w/v of potassium benzoate, 15% v/v of benzyl alcohol, and 15% v.v of Plurafac RA40, the remainder being water, Plurafac RA40 is a modified alcohol ethoxylate manufactured by Pechiney-Ugine-Kuhlmann. Similar results were obtained.

EXAMPLE 10

As a comparison, a plate prepared according to Example 3 was developed using an aqueous solution containing 15% w/v of sodium benzoate and 15% v/v of Antarox LF 330, the remainder being water. The non-image areas were found to be stained and when a number of plates were developed using a processing machine, the developer soon produced unacceptable foam levels.

EXAMPLE 11

To show the syngeristic effect of using a combination of aliphatic and aromatic acid salts, three plates prepared according to Example 1 were exposed through a step wedge and developed respectively with the developers of Example 3 (Plate 1), Example 4 (Plate 2), and Example 10 (Plate 3).

Plate 1 had clean non-image areas and the step-wedge showed a solid step 6 and a tail step 17. Plate 2 had equally clean non-image areas and a solid step 6 and a tail step 15. Plate 3 had badly stained non-image areas and the tail of the step-wedge was impossible to ascertain due to scumming of the plate in this area.

EXAMPLE 12

To show the foam suppressing effects, the developers of Examples 3, 4, 5 and 10 and a solution of a non-ionic surfactant alone (Antarox LF330) were each submitted to a foam test consisting of inverting 200 mls of the liquid under test in a sealed measuring cylinder and measuring the initial foam volume and the foam volume at half minute intervals. The results are shown in Table 1.

EXAMPLE 13

An aluminium sheet was electrochemically grained and anodised and then coated with the reaction product of an epoxy resin (Epikote 1004) and 4-azido-alpha-cyano-delta-chloro-cinnamylidene acetic acid. The resultant radiation sensitive plate was image-wise exposed to ultra-violet light beneath a negative transparency and developed with an aqueous solution containing 5% w/v of sodium octanoate, 5% w/v of sodium benzoate, 15% v/v 2-(2-methoxyethoxy)ethanol (methyl dioxitol) and 15% v/v Ukanil 50, the remainder being water, Ukanil 50 is an alcohol ethoxylate surfactant manufactured by Pechiney Ugine Kuhlmann. The developed plate was desensitised in conventional manner and produced many satisfactory copies. No foaming problems were encountered when a number of such plates were similarly developed using a plate processing machine.

EXAMPLE 14

The developer of Example 6 was used to process an image-wise exposed plate having a radiation sensitive coating comprising the reaction product of 3-methoxy-diphenylamine-4-diazonium sulphate/4'-bis methoxymethyl diphenyl ether condensation product and 2-mesitylene sulphonic acid. Similar results were obtained.

The preparation of the diazo compound is described in U.K. Patent Specification No. 1,312,926.

EXAMPLE 15

The developer of Example 6 was used to process an image-wise exposed plate having a radiation sensitive coating comprising the reaction product of 2 moles p-(N-ethyl-N-$\beta$-hydroxy ethyl)-amino benzene diazonium chloro zincate/1 moles sebacyl chloride condensation product and 2-hydroxy-4-methoxy benzophenone-5-sulphonic acid. Similar results were obtained.

The preparation of the diazo compound is described in British Patent Application 2,003,147.

EXAMPLE 16

An aluminium sheet prepared according to Example 1 was whirler coated with a radiation sensitive composition comprising (i) 8.5 parts by weight of the reaction product of 2 moles acrylic acid and 1 mole bisphenol A diglycidyl ether, (ii) 2.1 parts by weight of an acrylic resin (Surcol 1339-Allied Colloids), (iii) 0.43 parts by weight of 2-(4'-methoxy styryl)-4,6-bis(trichloromethyl)-S-triazine.

The resultant radiation sensitive plate was image-wise exposed to a transparency and developed using an aqueous solution comprising 12.5% w/v of sodium octanoate and 12.5% w/v of Ethylan HB4, the remainder being water. The pH of the solution was adjusted to 10.5 by the addition of trisodium phosphate. Similar results were obtained.

TABLE 1

| | FOAM VOLUME ($cm^3$) | | | | | | | | | |
|---|---|---|---|---|---|---|---|---|---|---|
| | TIME (Minutes) | | | | | | | | | |
| | 0 | ½ | 1 | 1½ | 2 | 2½ | 3 | 3½ | 4 | 4½ | 5 |
| 15%v/vAntarox LF330 | 234 | 234 | 226 | 200 | 177 | 133 | 130 | 127 | 110 | 90 | 59 |
| Example 3 | 82 | 82 | 82 | 82 | 65 | 40 | 27 | 26 | 25 | 23 | 15 |
| Example 4 | 100 | 88 | 84 | 78 | 70 | 52 | 44 | 36 | 25 | 20 | 15 |
| Example 5 | 158 | 150 | 140 | 110 | 80 | 38 | 18 | 15 | 12 | 6 | 5 |
| Example 10 | 210 | 210 | 210 | 195 | 180 | 155 | 123 | 75 | 50 | 35 | 30 |

We claim:

1. A substantially aqueous developer for processing image-wise exposed negative working radiation sensitive plates which comprises an aqueous solution of a non-ionic surfactant, a salt of an aromatic carboxylic acid, and a salt of an aliphatic carboxylic acid containing up to nine carbon atoms.

2. A developer as claimed in claim 2 wherein the surfactant is an alcohol alcoxylate, a modified alcohol alcoxylate, or a phenol alcoxylate.

3. A developer as claimed in claim 2, and containing from 5 to 30% v/v of the surfactant.

4. A developer as claimed in claim 1 wherein the aliphatic carboxylic acid is propanoic acid, valeric acid, sorbic acid or nonanoic acid.

5. A developer as claimed in claim 1 wherein the aliphatic carboxylic acid contains 7 or 8 carbon atoms.

6. A developer as claimed in claim 5 wherein the aliphatic carboxylic acid is heptanoic acid, octanoic acid or 2-ethyl hexanoic acid.

7. A developer as claimed in claim 1 and containing from 20 to 300 grams per liter of the salt of the aliphatic carboxylic acid.

8. A developer as claimed in claim 1 and containing up to 300 grams per liter of the salt of the aromatic carboxylic acid.

9. A method of processing an imagewise exposed negative working radiation sensitive plate which comprises the step of developing the plate using a substantially aqueous developer comprising an aqueous solution of a non-ionic surfactant, a salt of an aromatic carboxylic acid, and a salt of an aliphatic carboxylic acid containing up to nine carbon atoms.

10. A method in accordance with claim 9 wherein the radiation sensitive plate has a radiation sensitive coating based on an organic solvent soluble diazo resin, a photocrosslinkable resin or a photopolymerisable olefinically unsaturated compound.

11. A developer as claimed in claim 1 wherein the aromatic carboxylic acid is benzoic acid or toluic acid.

12. A method in accordance with claim 9 wherein the aromatic carboxylic acid is benzoic acid or toluic acid.

* * * * *